(12) United States Patent
Kroeckel et al.

(10) Patent No.: US 6,545,475 B2
(45) Date of Patent: Apr. 8, 2003

(54) COIL FOR A MAGNETIC RESONANCE SYSTEM

(75) Inventors: Horst Kroeckel, Bamberg (DE); Arne Reykowski, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/180,413

(22) Filed: Jun. 26, 2002

(65) Prior Publication Data

US 2003/0001574 A1 Jan. 2, 2003

(30) Foreign Application Priority Data

Jun. 26, 2001 (DE) .......................................... 101 30 617

(51) Int. Cl.[7] .................................................. G01V 3/00
(52) U.S. Cl. ...................................................... 324/318
(58) Field of Search ................................. 324/322, 318, 324/300, 312, 314, 306, 307, 309; 600/410, 421

(56) References Cited

U.S. PATENT DOCUMENTS

| | | | | | |
|---|---|---|---|---|---|
| 5,250,944 | A | * | 10/1993 | Urbas et al. ........... | 340/870.31 |
| 5,551,430 | A | * | 9/1996 | Blakeley et al. ............ | 600/410 |
| 6,362,622 | B1 | * | 3/2002 | Stauber et al. .............. | 324/318 |

* cited by examiner

*Primary Examiner*—Louis Arana
(74) *Attorney, Agent, or Firm*—Schiff Hardin & Waite

(57) ABSTRACT

A coil for a magnetic resonance system has an antenna with which a magnetic resonance excitation signal can be emitted and/or a magnetic resonance signal can be received, and has a transponder from which coil-characteristic data can be emitted given electromagnetic excitation.

13 Claims, 1 Drawing Sheet

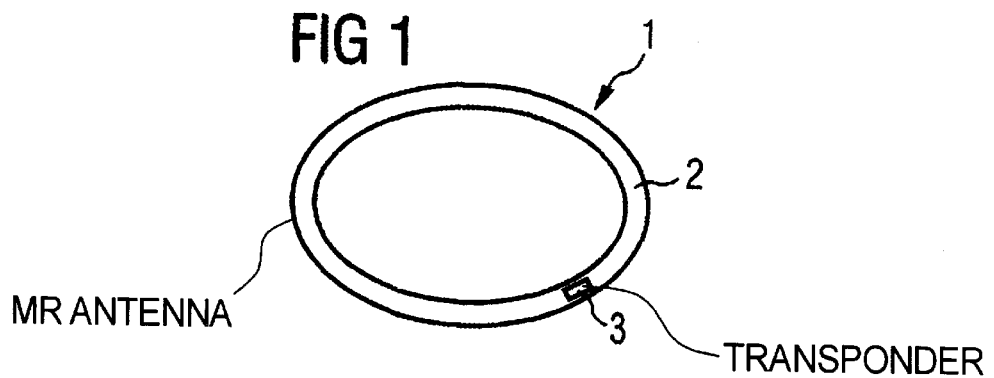
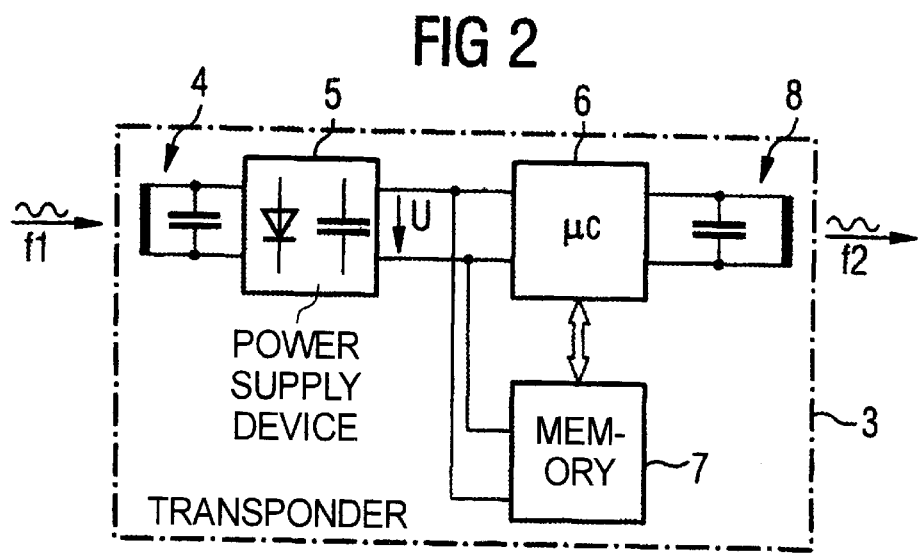
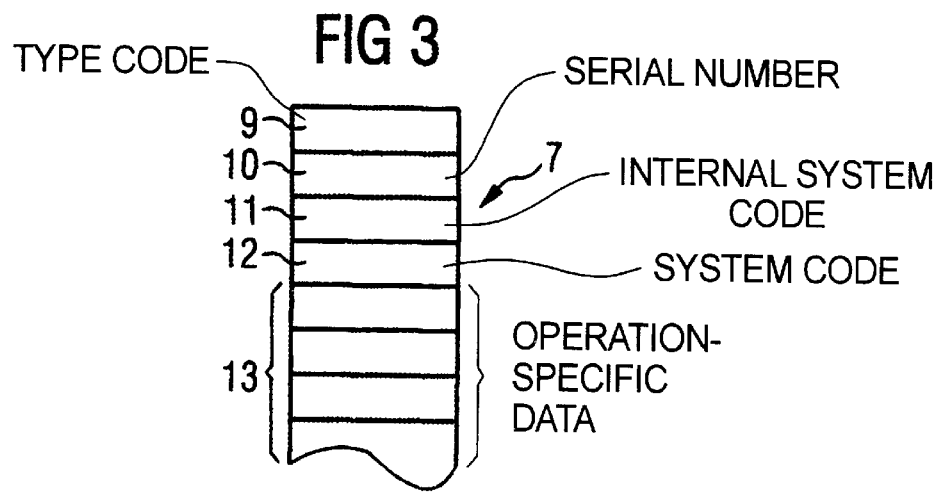

COIL FOR A MAGNETIC RESONANCE SYSTEM

BACKGROUND OF THE INVENTION

1. Field of the Invention

The present invention is directed to a coil for a magnetic resonance system, having an antenna with which a magnetic resonance excitation signal can be emitted and/or a magnetic resonance signal can be received.

2. Description of the Prior Art

Coils of the above type are well-known. They are employed both rigidly mounted at the system and as loosely arranged local coils.

Given such a coil, it is important to identify its presence in the magnetic resonance system. When a coil element of a coil is situated within an excitation field of the magnetic resonance system, it can lead to great stresses on the surrounding tissue due to a locally elevated RF excitation field if it is not appropriately detuned by a control signal. Identification of which coils are present in the system and which are not present therein must be made in order to be able to correctly operate the coils that are present.

A known identification technique is to acquire the presence of the coils via terminal plugs. In the prior art, the terminal plugs are individually coded at the coil side in order to be able to determine which coils are situated in the magnetic resonance system.

This known procedure is disadvantageous because, first, only connected coils can be identified and, second, there is only a limited number of coding possibilities by means of the terminal plugs. For example, 256 coil types can be distinguished given eight contact bridges that are optionally plugged or not plugged.

SUMMARY OF THE INVENTION

An object of the present invention is to provide a coil for a magnetic resonance system that can always be identified and that offers expanded coding possibilities.

This object is achieved in accordance with the invention in a coil for magnetic resonance system having a transponder from which data that are characteristic of the coil can be emitted given electromagnetic excitation.

When the transponder is fashioned as passive transponder, the transponder does not require its own energy source.

When the transponder transmits coil-characteristic data given excitation with a frequency within the bandwidth of the excitation coil, but beyond the magnetic resonance frequency range, it can be excited—without modifications—by the magnetic resonance system to transmit the coil-characteristic data.

The coil-characteristic data can include different types of information. A type code for the coil, a serial number for the coil, an internal system code for the coil, a system code and operation-specific data are examples.

DESCRIPTION OF THE DRAWINGS

FIG. 1 is a schematic illustration of a coil for a magnetic resonance system having a transponder in accordance with the present invention.

FIG. 2 is an exemplary block diagram of a transponder for use in the coil shown in FIG. 1.

FIG. 3 is a schematic illustration of memory contents for the transponder, in accordance with the present invention.

DESCRIPTION OF THE PREFERRED EMBODIMENTS

As shown in FIG. 1, a coil 1 for a magnetic resonance system (not shown) has an antenna 2. A magnetic resonance excitation signal can be emitted and/or a magnetic resonance signal can be received with the antenna 2. Typically these are RF signals.

A transponder 3 is arranged on the coil 1. The transponder 3 is preferably composed of anti-magnetic material.

As shown in FIG. 2, the transponder 3 has a reception resonant circuit 4. The reception resonant circuit 4 can be electromagnetically excited with a suitable excitation frequency f1. The excitation frequency f1 is basically arbitrarily selectable. In particular, it can be equal to the Larmor frequency of the magnetic resonance system. The excitation frequency f1, however, also can be a different frequency that the magnetic resonance system can generate. For hydrogen, the most frequent application, the Larmor frequency amounts to 42 MHz/T multiplied by the basic magnetic field of the magnetic resonance system.

Given excitation with the excitation frequency f1, an operating voltage U builds up in a power supply device 5. Due to suitable buffering, for example with a storage capacitor, the operating voltage U is maintained for some time after the end of the excitation with the excitation frequency f1. A micro-controller 6 and a memory 7 thus also can be operated for a limited time beyond the end of the electromagnetic excitation, even though the transponder 3 is fashioned as passive transponder, i.e. it does not include its own energy source.

The micro-controller 6 drives a transmission resonant circuit 8, so that it oscillates with a transmission frequency f2. The controller 6 modulates the oscillation of the transmission resonant circuit 8 according to the content of the memory 7, which it reads out for this purpose. The reception resonant circuit 8 of the transponder also may be employed as the transmission resonant circuit 4. As a result, simultaneous transmission and reception of the transponder 3 and reloading of energy into the transponder 3 are possible.

As shown in FIG. 3, the memory 7 is an electrically erasable programmable read-only memory (EEPROM). A type code 9, a serial number 10, an internal system code 11 for the coil 1, a system code 12 as well as operation-specific data 13 are stored in the memory 7.

The type code 9 is characteristic of the type of coil 1. It can, for example, be composed of a manufacturer code and an ordering number. The serial number 10 is simply a running number that serves for distinguishing between the individual coils of a particular type. Each coil 1 thus can be distinguished from other coils by means of the combination of the type code 9 with the serial number 10.

The internal system code 11 is usually a number assigned within the magnetic resonance system for a specific coil 1. The system code 12 is a code for the magnetic resonance system to which the coil 1 belongs.

The operation-specific data 13 include, for example, data about the date of manufacture of the coil 1 or its age, settings, when the next maintenance is due and how often the coil 1 has already been used and the like.

With the inventive coil 1, a comprehensive identification of each coil 1 that is not galvanically connected to the magnetic resonance system is also possible in a simple way.

Although modifications and changes may be suggested by those skilled in the art, it is the intention of the inventors to embody within the patent warranted hereon all changes and modifications as reasonably and properly come within the scope of their contribution to the art.

We claim as our invention:

1. A coil arrangement comprising:
   an antenna operable in a mode selected from the group consisting of emitting magnetic resonance excitation signals and receiving magnetic resonance signals; and
   a transponder in fixed relation to said antenna, said transponder being electromagnetically excitable and, upon electromagnetic excitation, emitting a transponder signal containing coil-characteristic data.

2. A coil arrangement as claimed in claim 1 wherein said transponder is a passive transponder.

3. A coil arrangement as claimed in claim 2 wherein said transponder is electromagnetically excitable at a Larmor frequency of a magnetic resonance system in which said antenna is operated in said mode.

4. A coil arrangement as claimed in claim 1 wherein said transponder is composed of non-magnetic material.

5. A coil arrangement as claimed in claim 1 wherein said transponder includes a memory containing a type code for said antenna as said coil-characteristic data.

6. A coil arrangement as claimed in claim 1 wherein said transponder includes a memory containing a serial number for said antenna as said coil-characteristic data.

7. A coil arrangement as claimed in claim 1 wherein said transponder includes a memory containing a internal system code for said antenna as said coil-characteristic data.

8. A coil arrangement as claimed in claim 1 wherein said transponder includes a memory containing a system code for a magnetic resonance system in which said antenna is operated in said mode, as said coil characteristic data.

9. A coil arrangement as claimed in claim 1 wherein said transponder includes a memory containing operation-specific data for said antenna, as said coil-specific data.

10. A coil arrangement comprising:
    a radio-frequency magnetic resonance antenna; and
    a transponder in fixed relation to said antenna, said transponder comprising a transmission circuit including a control unit, a memory connected to said control unit containing coil-characteristic data, and a resonator operated by said control unit to emit a transponder signal containing said coil-characteristic data.

11. A coil arrangement as claimed in claim 10 wherein said memory contains coil-characteristic data selected from the group consisting of a type code for said antenna, a serial number for said antenna, an internal system code for said antenna, a system code for a magnetic resonance system in which said antenna is employed, and operation-specific data for said antenna.

12. A coil arrangement as claimed in claim 10 further comprising an excitation circuit connected to said control unit, said excitation circuit being electromagnetically excitable at a predetermined excitation frequency to energize said control unit to enable said resonator to emit said transponder signal.

13. A coil arrangement as claimed in claim 12 wherein said excitation circuit is electromagnetically excitable at a Larmor frequency of a magnetic resonance system in which said antenna is employed.

* * * * *